United States Patent
Takano et al.

(10) Patent No.: US 7,248,842 B2
(45) Date of Patent: *Jul. 24, 2007

(54) WIRELESS COMMUNICATION APPARATUS HAVING A PHASE CONTROL LOOP SHARED BY FIRST AND SECOND MODULATION MODES AND AN AMPLITUDE CONTROL LOOP

(75) Inventors: Ryoichi Takano, Takasaki (JP);
Kazuhiko Hikasa, Hamura (JP);
Yasuyuki Kimura, Maebashi (JP);
Hiroshi Hagisawa, Tamamura (JP);
Patrick Wurm, Comberton (GB);
Robert Astle Henshaw, Sudbury (GB);
David Freeborough, Balsham (GB)

(73) Assignees: Renesas Technology Corp., Tokyo (JP); Tipcom Limited, Royston (GB)

( * ) Notice: Subject to any disclaimer, the term of this patent is extended or adjusted under 35 U.S.C. 154(b) by 0 days.

This patent is subject to a terminal disclaimer.

(21) Appl. No.: 11/442,263

(22) Filed: May 30, 2006

(65) Prior Publication Data

US 2006/0217081 A1 Sep. 28, 2006

Related U.S. Application Data

(63) Continuation of application No. 10/373,031, filed on Feb. 26, 2003, now Pat. No. 7,085,544.

(30) Foreign Application Priority Data

May 31, 2002 (GB) .................... 0212729.8

(51) Int. Cl.
  *H04B 1/02* (2006.01)
(52) U.S. Cl. .................. 455/102; 455/126; 455/110; 375/300; 375/302

(58) Field of Classification Search ............... 455/102, 455/126, 127.2, 123, 108, 522, 552.1, 110, 455/424, 425, 456.5, 456.6, 550.1, 575.1, 455/138, 67.11, 67.16, 69, 136, 147, 180.1, 455/139, 188.1, 304, 114.3, 127.4, 91, 553.1; 375/302, 303, 305, 271, 274, 298, 306, 307, 375/376, 296, 297, 285, 295, 265, 283, 345, 375/219; 330/129, 282, 141, 281, 149, 136, 330/151; 370/205, 347, 344; 331/17, 1 R, 331/1 A, 25, 10
See application file for complete search history.

(56) References Cited

U.S. PATENT DOCUMENTS

| | | | |
|---|---|---|---|
| 4,571,549 A | 2/1986 | Lods et al. | |
| 5,091,706 A | 2/1992 | Lautzenhiser | |
| 5,101,506 A | 3/1992 | Walls | |
| 5,408,197 A * | 4/1995 | Miyake | 330/129 |
| 5,430,416 A | 7/1995 | Black et al. | |
| 5,790,601 A * | 8/1998 | Corrigan et al. | 375/302 |
| 5,802,450 A | 9/1998 | Horton | |
| 5,910,753 A | 6/1999 | Bogdan | |
| 6,018,275 A | 1/2000 | Perrett et al. | |
| 6,147,553 A | 11/2000 | Kolanek | |
| 6,215,362 B1 | 4/2001 | Feng et al. | |
| 6,476,681 B1 * | 11/2002 | Kirkpatrick | 331/17 |
| 6,671,337 B1 * | 12/2003 | Cordoba | 375/345 |
| 7,085,544 B2 * | 8/2006 | Takano et al. | 455/102 |
| 2002/0071497 A1 | 6/2002 | Bengtsson et al. | |
| 2002/0080716 A1 | 6/2002 | Asam et al. | |
| 2002/0158621 A1 * | 10/2002 | Tao et al. | 324/76.35 |
| 2004/0248528 A1 * | 12/2004 | Rozenblit et al. | 455/126 |

FOREIGN PATENT DOCUMENTS

| | | |
|---|---|---|
| DE | 100 56 472 | 11/2000 |
| EP | 0 339 605 | 4/1989 |
| EP | 0 457 749 | 11/1991 |
| EP | 0 535 669 | 1/1992 |
| EP | 0 731 556 | 9/1996 |
| EP | 0 786 864 | 7/1997 |
| EP | 0 788 236 | 8/1997 |
| EP | 0 797 298 | 9/1997 |
| EP | 1211801 | 6/2002 |
| EP | 1 115 205 | 7/2002 |
| GB | 2 237 157 | 4/1991 |
| GB | 2291754 | 1/1996 |

| GB | 2 369 941 | 6/2002 |
| GB | 2369941 | 6/2002 |
| JP | 3-209994 | 9/1991 |
| JP | 4-372246 | 12/1992 |
| JP | 11-355139 | 12/1999 |
| JP | 2000-244341 | 9/2000 |
| SU | 756603 | 8/1980 |
| WO | 95/23453 | 8/1995 |
| WO | 01/41296 | 6/2001 |
| WO | 02/37666 | 5/2002 |

OTHER PUBLICATIONS

P.B. Kenington, "High Linearity RF Amplifier Design," published by Artech House, Inc. 1979. p. 162.

* cited by examiner

*Primary Examiner*—Edward F. Urban
*Assistant Examiner*—Charles Chow
(74) *Attorney, Agent, or Firm*—Mattingly, Stanger, Malur & Brundidge, P.C.

(57) ABSTRACT

A transmitter adopting a polar loop system including a phase control loop for controlling the phase of a carrier signal outputted from a transmitting oscillator and an amplitude control loop for controlling the amplitude of a transmitting output signal outputted from a power amplification circuit, and designed to be capable of performing transmission using a GMSK modulation mode and transmission using an 8-PSK modulation mode. In the transmitter, the phase control loop is shared as a phase control loop for use in the GMSK modulation mode and a phase control loop for use in the 8-PSK modulation mode. A component similar to any one of components constituting a loop filter is provided in parallel therewith so that the component can be connected or disconnected in accordance with the modulation mode, for example, by use of a switching element.

4 Claims, 12 Drawing Sheets

ADP

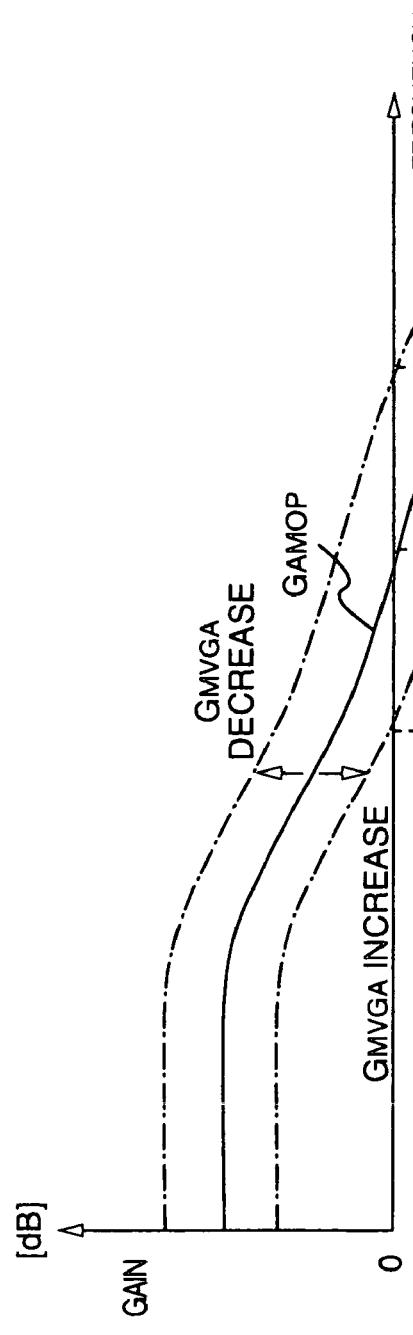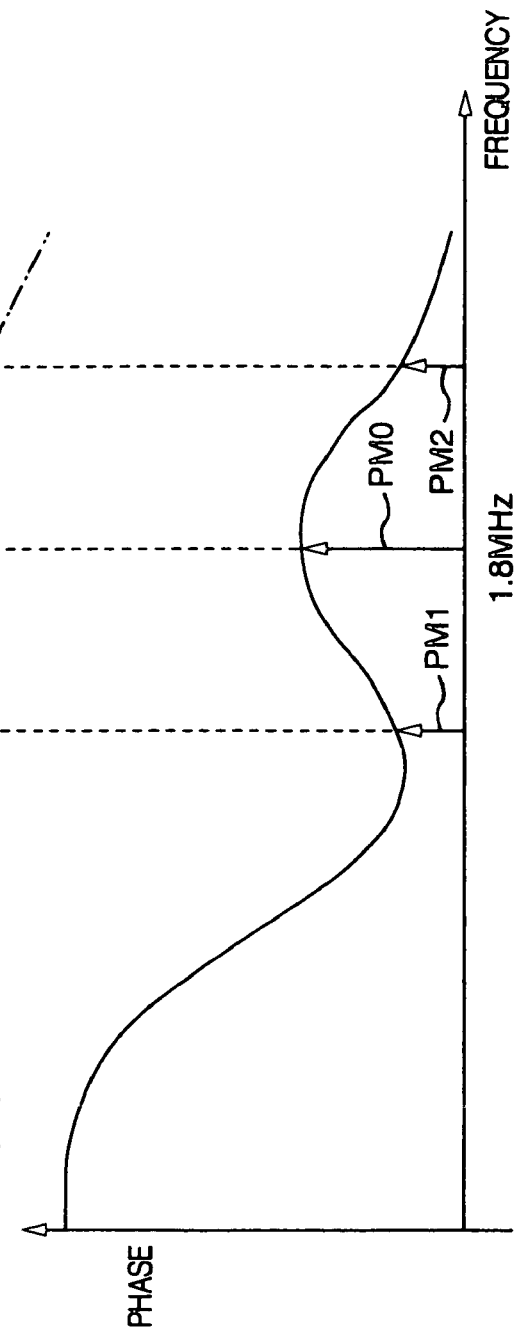
FIG. 12 (A)
FIG. 12 (B)

WIRELESS COMMUNICATION APPARATUS HAVING A PHASE CONTROL LOOP SHARED BY FIRST AND SECOND MODULATION MODES AND AN AMPLITUDE CONTROL LOOP

CROSS-REFERENCE TO RELATED APPLICATIONS

This is a continuation application of U.S. Ser. No. 10/373,031, filed Feb. 26, 2003 now U.S. Pat. No. 7,085,544.

The present application relates to subject matters described in the U.S. patent applications being file based on the United Kingdom Patent Applications No. 0212737.1 filed on May 31, 2002, No. 0212725.6 filed on May 31, 2002, No. 0212723.1 filed on May 31, 2002, No. 0212735.5 filed on May 31, 2002, and No. 0212732.2 filed on May 31, 2002. All of those U.S. applications are assigned to the same assignees of the present application.

BACKGROUND OF THE INVENTION

The present invention relates to a technique effective in application to a radio communication system having a phase control loop and an amplitude control loop for phase and amplitude modulation, and more particularly relates to a technique effective in application to a semiconductor integrated circuit for communication with a phase detection circuit and an amplitude detection circuit built in, and to a transmitter such as a cellular phone in which such a semiconductor integrated circuit for communication has been incorporated.

In the background art, as one of systems of transmitters (mobile transmitters) such as cellular phones and the like, there is a system called GSM (Global System for Mobile Communication) which has been adopted in Europe. In this GSM system, a phase modulation system called GMSK (Gaussian Minimum Shift Keying) is used as its modulation system so as to shift the phase of a carrier signal in accordance with transmitting data.

Generally, a high frequency power amplification circuit is incorporated in a transmission-side output portion in a transmitter. Some conventional transmitters using the GSM system adopt a configuration in which a bias voltage to the high frequency power amplification circuit is controlled to obtain output power required for a telephone call by a control voltage outputted from a circuit called an APC (Automatic Power Control) circuit generating a control signal for transmitting output on the basis of a signal from a detector detecting the transmitting output and a transmitting level requested from a base band LSI.

In recent cellular phones, an EDGE (Enhanced Data Rates for GSM Evolution) system has been proposed. The EDGE system has a dual-mode communication function in which communication of audio signals is performed in GMSK modulation while data communication is performed in $3\pi/8$ rotating 8-PSK (Phase Shift Keying) modulation. The 8-PSK modulation can be regarded as a modulation in which an amplitude shift is further added to a phase shift of a carrier signal in the GMSK modulation. While one-bit information is sent per symbol in the GMSK modulation, 3-bit information can be sent per symbol in the 8-PSK modulation. Thus, communication can be performed at a higher transmission rate in the EDGE system than in the GSM system.

As a method for implementing a modulation system in which the phase component and the amplitude component of a transmitting signal are allowed to carry information respectively, there has been heretofore known a system called a polar loop in which a signal to be transmitted is separated into a phase component and an amplitude component, fed back by a phase control loop and an amplitude control loop respectively, synthesized and outputted by an amplifier (for example, "High Linearity RF Amplifier Design" by Kenington, Peter B., p. 162, published by ARTECH HOUSE, INC., 1979).

In a communication system using the GSM system, it will go well if a phase-modulated signal is outputted in accordance with a requested output level. Accordingly, a radio frequency power amplification circuit in the final stage can be operated in the saturation region. On the other hand, in a radio communication system capable of performing transmission and reception using the EDGE system, a radio frequency power amplification circuit in the final stage has to be operated linearly in the non-saturation region because it is necessary to perform amplitude control. However, in a conventional system for driving a radio frequency power amplification circuit used in a communication system using the GSM system, it is difficult to secure linearity requested of the radio frequency power amplification circuit in an area of a low output level. On the other hand, according to the polar loop system, there is an advantage that the request for the linearity of the radio frequency power amplification circuit can be satisfied while the power efficiency in an area of a low output level can be also improved.

Therefore, the present inventors made investigations on adoption of the polar loop system in a radio communication system using the EDGE system. As a result, it was found that there was a problem that it was difficult to satisfy requested specifications in the error vector magnitude (EVM) of transmission waveform, the degree of noise suppression, and the like, when the 8-PSK modulation was implemented in the polar loop system.

Specifically, with a broader frequency bandwidth (the width between the central frequency of a transmitting carrier signal and a frequency in which the open loop gain reaches 0 dB) of the amplitude control loop, EVM is enhanced, and a characteristic called spectral regrowth showing the degree of waveform distortion is also improved. However, if the bandwidth is broader, there will arise a problem as follows. That is, the attenuation of the amplitude control loop in the reception frequency 20 MHz distant from the central frequency of the transmitting carrier signal becomes so small that a sufficient degree of noise suppression cannot be obtained.

However, of the two feedback loops, particularly the amplitude control loop has a loop gain varied due to scattering in manufacturing, so that the stability of the loop is degraded. It is therefore difficult to obtain a desired output level in a predetermined time. Further, in a system using the polar loop system, it was found that there was a problem that when the output control was carried out for the amplitude modulation in the amplitude control loop, the gain of the amplitude control loop varied so that the phase margin was reduced and hence the stability of the loop was degraded.

When a radio frequency IC for a transmitter capable of performing both the transmission using a GMSK modulation mode and the transmission using an 8-PSK modulation mode is configured, each of the feedback loops requires a loop filter for limiting the frequency bandwidth of the loop. It was, however, found that it was desired to change the frequency bandwidths of the respective loops between the GMSK modulation mode and the 8-PSK modulation mode.

It was considered at first that a phase control loop for use in the GMSK modulation mode and a phase control loop for use in the 8-PSK modulation mode were provided separately. It was, however, found that there was a problem that such a configuration led to increase of the number of components for constituting the loop filters having different properties so that the circuit scale increased.

At the beginning of transmitting in the 8-PSK modulation mode, the two feedback loops, that is, the phase control loop and the amplitude control loop have to be first stabilized. In that case, however, it is difficult to stabilize the two feedback loops concurrently. It was therefore considered that the phase control loop was first stabilized and the amplitude control loop was then stabilized. It was, however, found that there was a problem that the two feedback loops had to be stabilized in a short time in the EDGE system while the GSM system had a comparatively large time margin because only the phase control loop had to be stabilized.

In the conventional GSM system, an APC circuit generating a control signal for transmitting output on the basis of a signal from the detector detecting the transmitting output and a transmitting level requested from the base band circuit has been used as described above. The present inventors hit upon an idea that if the amplitude control loop provided in the polar loop was used, the APC circuit could be omitted when the GMSK modulation mode was implemented in the GSM system or the EDGE system. The inventors therefore made investigations on the idea. As a result, it was found that there was a problem as follows. That is, when a loop filter on the amplitude control loop was designed to meet the GMSK modulation mode, the degree of noise suppression in the reception signal frequency band 20 MHz distant from the carrier frequency became insufficient at the time of operation in the 8-PSK modulation mode. On the contrary, when the loop filter was designed to meet the 8-PSK modulation mode, the phase margin of the loop became insufficient at the time of operation in the GMSK modulation mode or in the case where the output of the power amplifier was very small. Thus, the loop was instable, that is, apt to oscillate.

SUMMARY OF THE INVENTION

An object of the present invention is to provide a transmitter such as a cellular phone having a function to perform phase modulation and amplitude modulation, in which the error vector magnitude of transmission wavelength and the spectral regrowth can be improved while the noise reaching the reception frequency band can be suppressed sufficiently.

Another object of the invention is to provide a technique by which the number of components constituting a circuit and the occupied circuit area and hence the chip size can be reduced in a transmitter adopting a polar loop system having two feedback loops, that is, a phase control loop and an amplitude control loop.

A further object of the invention is to provide a technique by which the phase control loop can be stabilized in a short time at the start of operation in a transmitter adopting a polar loop system having two feedback loops, that is, a phase control loop and an amplitude control loop.

A still further object of the invention is to provide a technique by which in a transmitter adopting a polar loop system, insufficiency in the degree of noise suppression in the reception signal frequency band can be prevented or lowering in the stability of the amplitude control loop due to reduction in phase margin of the loop can be prevented by properties of a loop filter.

The above-mentioned and other objects and novel features of the invention will be made obvious from the description of this specification and the accompanying drawings.

A brief description will be given to the summary of a representative of the invention disclosed in this application as follows.

That is, in a transmitter which adopts a polar loop system including a phase control loop for controlling the phase of a carrier signal outputted from a transmitting oscillator and an amplitude control loop for controlling the amplitude of a transmitting output signal outputted from a power amplification circuit, and which is designed to be capable of performing transmission using a GMSK modulation mode and transmission using an 8-PSK modulation mode, the phase control loop is shared as a phase control loop for use in the GMSK modulation mode and a phase control loop for use in the 8-PSK modulation mode. Thus, the number of elements constituting a circuit (radio frequency IC) can be reduced, and the occupied circuit area and hence the chip size per se can be reduced.

In addition, when the phase control loop is shared as a phase control loop for use in the GMSK modulation mode and a phase control loop for use in the 8-PSK modulation mode in such a manner, it is desired that the frequency bandwidth of the phase control loop is varied in accordance with the respective modulation modes. To this end, a component similar to any one of components constituting a loop filter is provided in parallel therewith so that the component can be connected or disconnected in accordance with a modulation mode, for example, by use of a switching element. Thus, the properties of the loop filter on the phase control loop are varied in accordance with the respective modulation modes simply by switching the switching element, so that the phase control loop can be set to have an optimum frequency bandwidth.

Table 1 shows a simulation result of error vector magnitude (EVM) when a transmitting circuit adopting a polar loop system was operated in the 8-PSK modulation mode while the frequency bandwidth of the phase control loop and the frequency bandwidth of the amplitude control loop were varied variously.

TABLE 1

| AM Loop Open Loop Bandwidth (MHz) | PM Loop Open Loop Bandwidth (MHz) | | | | | |
|---|---|---|---|---|---|---|
| | 0.647 | 1.151 | 1.8 | 2.047 | 3.639 | 6.467 |
| 0.647 | 5.99 | | | | | 4.84 |
| 1.151 | | 2.03 | | 1.38 | 1.30 | 1.29 |
| 1.8 | | | | | | |
| 2.047 | | 1.64 | | 0.65 | 0.45 | 0.42 |
| 3.639 | | 1.60 | | 0.51 | 0.20 | 0.14 |
| 6.467 | 3.69 | 1.59 | | 0.50 | 0.16 | 0.06 |
| | | | | | | (%) |

Table 2 shows spectral regrowth (attenuation of signal level of a frequency 0.4 MHz distant from the frequency of a carrier signal) obtained by a simulation carried out in similar conditions.

TABLE 2

| AM Loop Open Loop Bandwidth (MHz) | PM Loop Open Loop Bandwidth (MHz) | | | | | |
|---|---|---|---|---|---|---|
| | 0.647 | 1.151 | 1.8 | 2.047 | 3.639 | 6.467 |
| 0.647 | −46 | | | | | −42 |
| 1.151 | | −50 | | −54 | −52 | −51 |
| 1.8 | | | | | | |
| 2.047 | | | −47 | −60 | −61 | −59 |
| 3.639 | | | −46 | −58 | −69 | −68 |
| 6.467 | −41 | −46 | | −57 | −69 | −73 |
| | | | | | | (dBm/100 kHz) |

It is understood from Tables 1 and 2 that the error vector magnitude and the spectral regrowth are improved as the frequency bandwidths of the phase control loop and the amplitude control loop are made broader. On the other hand, Table 3 shows noise obtained by a simulation carried out in similar conditions.

TABLE 3

| AM Loop Open Loop Bandwidth (MHz) | PM Loop Open Loop Bandwidth (MHz) | | | | | |
|---|---|---|---|---|---|---|
| | 0.647 | 1.151 | 1.8 | 2.047 | 3.639 | 6.467 |
| 0.647 | −82.9 | | | | | −66.6 |
| 1.151 | | | | −81.1 | | |
| 1.8 | | | −80.7 | | | |
| 2.047 | | −80.7 | | −79.8 | | |
| 3.639 | | | | | −73.3 | |
| 6.467 | −71.0 | | | | | −65.3 |
| | | | | | | (dBm/100 kHz) |

It is understood from Table 3 that the degree of noise suppression is improved as the frequency bandwidths of the phase control loop and the amplitude control loop are made narrower. From Tables 1 to 3, all the properties do not satisfy required specifications sufficiently when the frequency band of the loop is 1.151 MHz, but satisfy the required specifications sufficiently when the frequency band is 2.047 MHz. Thus, in the present invention, the frequency band of the amplitude control loop in the 8-PSK modulation mode was set to be (the frequency of a carrier signal ±1.8 MHz).

BRIEF DESCRIPTION OF THE DRAWINGS

FIGS. 12(A) and 12(B) are graphs showing the open gain characteristic and the phase characteristic of the amplitude control loop in the transmitter of FIG. 1;

DESCRIPTION OF THE EMBODIMENTS

Figure 1:
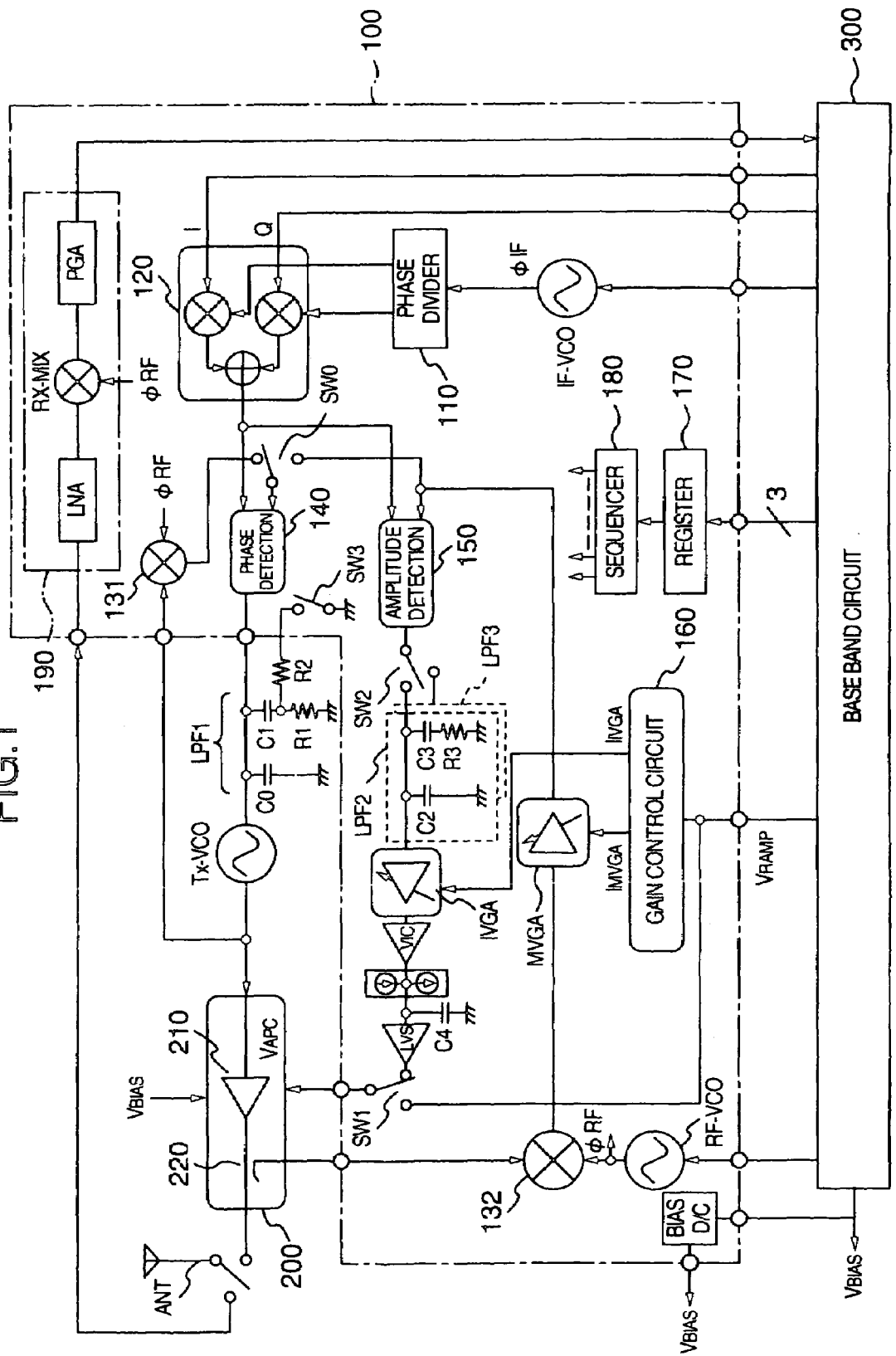
FIG. 1 is a block diagram showing a schematic configuration of a transmitter of a polar loop system according to an embodiment of the present invention and a configuration example of a radio communication system using the transmitter.

FIG. 1 shows a schematic configuration of a transmitter of a polar loop system according to an embodiment of the present invention. In FIG. 1, a reference numeral 100 represents a radio frequency IC which can perform GMSK modulation in a GSM system or 8-PSK modulation in an EDGE system; 200, a power module including a radio frequency power amplification circuit (hereinafter referred to as "power amplifier") 210 for driving an antenna ANT so as to perform transmission, a coupler 220 for detecting transmitting power, and so on; 300, a base band circuit for generating I/Q signals on the basis of transmitting data (base band signal) or generating a control signal for the radio frequency IC 100 or a bias voltage $V_{BIAS}$ for the power amplifier 210 in the power module 200; TxVCO, a transmitting oscillator for generating a phase-modulated transmitting signal (carrier signal), and LPF1, a loop filter for limiting the bandwidth of a phase control loop.

The radio frequency IC 100 is formed as a semiconductor integrated circuit on one semiconductor chip. As well as the above-mentioned transmission-system circuit, a reception-system circuit 190 is also formed on the chip of the radio frequency IC 100. The reception-system circuit 190 is constituted by a low noise amplifier (LNA), a mixer (Rx-MIX) for down-converting a reception signal directly into a base band signal, a high-gain programmable gain amplifier (PGA), and so on. The radio frequency IC 100, the transmitting oscillator TxVCO, the loop filter LPF, and so on, can be mounted on one insulating substrate such as a ceramic substrate so as to be formed as a module. The polar loop in this embodiment has two control loops. One is a feedback loop for phase control (hereinafter referred to as "phase loop") and the other is a feedback loop for amplitude control (hereinafter referred to as "amplitude loop or "AM loop"")

The radio frequency IC 100 constituting the polar loop in this embodiment includes a phase divider 110 for generating signals whose phases are shifted by 90° from an intermediate frequency oscillation signal φIF generated by an oscillator IF-VCO; an orthogonal modulator 120 for mixing I/Q signals supplied from the base band LSI 300 and the signals divided by the phase divider 110 respectively so as to perform orthogonal modulation; a mixer 131 for mixing a feedback signal from the transmitting oscillator TxVCO and an oscillation signal φRF from a radio frequency oscillator RF-VCO so as to down-convert the feedback signal into a signal of 80 MHz for example; a phase detection circuit 140 for detecting a phase difference between the output signal from the mixer 131 and the output signal from the orthogonal modulator 120; a mixer 132 for mixing a detection signal from the coupler 220 for detecting the output level of the power amplifier 210 and the oscillation signal φRF from the radio frequency oscillator RF-VCO; a feedback-side variable gain amplification circuit MVGA for amplifying the output of the mixer 132; an amplitude detection circuit 150 for comparing the amplified signal from MVGA and the output signal from the orthogonal modulator 120 so as to detect an amplitude difference; a loop filter LPF2 for generating a voltage proportional to the output of the amplitude detection circuit 150 and limiting the frequency bandwidth of the amplitude loop; a forward-side variable gain amplification circuit IVGA for amplifying the output of the loop filter LPF2; a voltage to current converter VIC; a gain control circuit 160 for controlling the gains of the variable gain amplification circuits MVGA and IVGA; a register 170 for setting control information, an operation mode, and so on, inside the chip; a sequencer 180 for supplying timing signals to the respective circuits inside the chip on the basis of the setting in the register 170 so as to operate the respective circuits in a predetermined order corresponding to the set operation mode; and so on.

The amplitude loop is constituted by a loop from the coupler 220 to the power amplifier 210 through the mixer 132, the variable gain amplification circuit MVGA, the amplitude detection circuit 150, the loop filter LPF2, the variable gain amplification circuit IVGA.

The amplitude loop is called the MAIN loop. Further, in this embodiment, the phase loop is constituted by a loop from the phase detection circuit 140 back to the phase detection circuit 140 through the loop filter LPF1, the transmitting oscillator TxVCO and the mixer 131.

This phase loop is called the SUB loop. Specifically, when there occurs a phase difference between the output signal from the orthogonal modulator 120 and the feedback signal from the mixer 131, a voltage to reduce the difference is supplied to the frequency control terminal of the transmitting oscillator TxVCO so that the phase of the feedback signal from the mixer 131 coincides with the phase of the output signal from the orthogonal modulator 120. By this phase SUB loop, control is made to prevent the phase of the output of the transmitting oscillator TxVCO from shifting due to the fluctuation of a power supply voltage or the change of temperature. Incidentally, the amplitude of the transmitting oscillator TxVCO is constant.

In this embodiment, a change-over switch SW0 is provided for feeding the output of the variable gain amplification circuit MVGA back to the phase detection circuit 140 so that the path from the coupler 220 to the variable gain amplification circuit MVGA through the mixer 132 can be used as a common feedback path of the amplitude loop and the phase loop. The switch SW0 is switched by the sequencer 180 in accordance with the conditions of the register 170 set from the base band LSI 300.

The output of the power amplifier 210 includes both a phase-modulated component and an amplitude-modulated component in the EDGE mode. Thus, either the output of the transmitting oscillator TxVCO or the output of the power amplifier 210 may be used as a feedback signal to the phase detection circuit 140 having an output-side phase component. However, at the beginning of transmission, the output of the power amplifier 210 has not yet been started up. It is therefore impossible to lock the phase loop with a feedback signal from the amplitude loop. On the other hand, the feedback path for the amplitude loop is essential in the EDGE modulation mode in order to correct the distortions introduced by the power amplifier. Therefore, once the loop is locked, the amplitude loop may be shared to block the phase loop in a narrow sense including the mixer 131. Thus, the power consumption can be reduced while the phase modulation can be performed with higher accuracy. Accordingly, in this embodiment, at the start-up time of output, the switch SW0 is operated to perform switching of selection of the feedback signal from the phase SUB loop. Then, once the loop is stabilized, the switch SW0 is switched to select the feedback signal from the amplitude loop or phase MAIN loop.

The loop filter LPF1 on the phase loop is constituted by capacitors C0 and C1 and a resistor R1 connected in series with the capacitor C1. The values of the respective capacitors and resistor are determined so that the loop filter LPF1 takes a frequency bandwidth with high noise suppression capability, for example, 1.2 MHz, in consideration of the GMSK modulation mode comprising only phase modulation.

Figure 2:
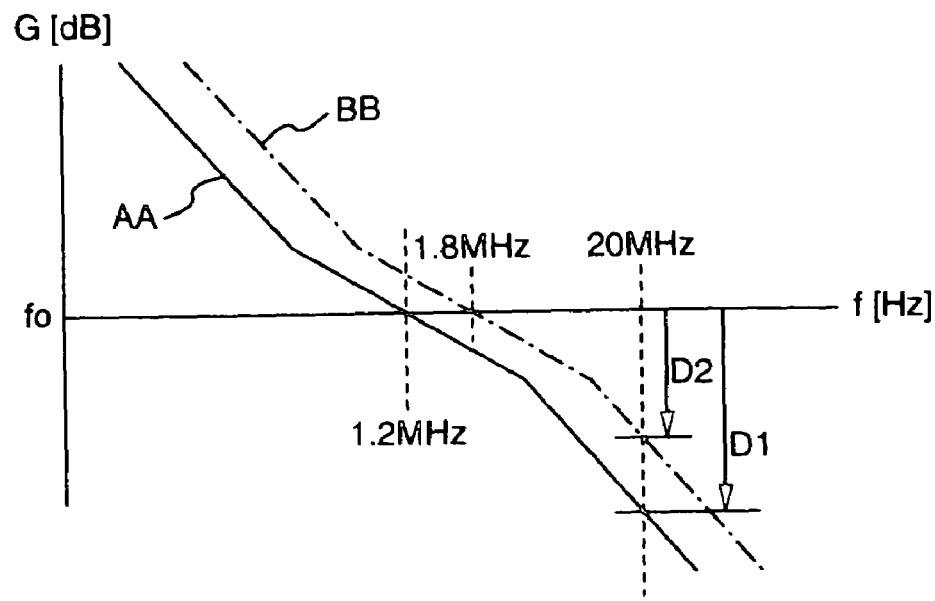
FIG. 2 is a graph showing the open gain characteristic of a phase loop in the transmitter in FIG. 1.

FIG. 2 shows an open loop gain characteristic of the phase loop. In FIG. 2, the abscissa designates the frequency in logarithmic scale with reference to a carrier frequency f0, and the ordinate designates the gain. The solid line AA designates the gain characteristic of the phase loop when the loop gain is set to be 1.2 MHz, and the chain line BB designates the gain characteristic of the phase loop when the loop gain is set to be 1.8 MHz. The distances D1 and D2 designate the signal attenuation of the phase loop at a reception signal frequency 20 MHz distant from the carrier frequency respectively when the loop gain is set to be 1.2 MHz and when the loop gain is set to be 1.8 MHz. It is understood from FIG. 2 that the 20 MHz offset noise quantity is smaller when the loop gain is set to be 1.2 MHz than when the loop gain is set to be 1.8 MHz, that is, the quantity of a signal disturbing the receiver channels is lower.

In this embodiment, a resistor R1 is connected in parallel to a series connection of the resistor R2 and a switch SW3. The resistors R1 and R2 and the switch SW3 are provided so that the phase loop can be shared between the GMSK modulation mode and the 8-PSK modulation mode. When the switch SW3 is turned on, the resistor R2 is connected in parallel with the resistor R1 so that the frequency bandwidth of the loop filter LPF1 is extended to be 1.8 MHz. That is, the amplitude loop whose frequency bandwidth is 1.8 MHz is made valid in the 8-PSK modulation mode. Accordingly, when the switch SW3 is turned on, the frequency bandwidth of the loop filter LPF1 is set to be 1.8 MHz identical to the frequency bandwidth of the amplitude loop. Thus, the operation is stabilized.

On the other hand, in the GMSK modulation mode, the amplitude loop whose bandwidth is 1.8 MHz is made invalid. Accordingly, when the switch SW3 is turned off, the frequency bandwidth of the loop filter LPF1 is set to be 1.2 MHz narrower than the frequency bandwidth of the amplitude loop so that the stability of the loop and the noise immune capability can be enhanced. Specifically, when the values of the capacitors C0, C1 and the resistor R1 are 1.5 nF, 12 nF and 30Ω respectively, and the value of the resistor R2 is set to be 56Ω by way of example, the phase loop can be set to have the aforementioned desired frequency bandwidth.

In this embodiment, without any limitation, the phase loop filter LPF1 (including the resistor R2) is formed as an external circuit attached to the radio frequency IC 100, while the switch SW3 is formed on the chip of the radio frequency IC 100 together with the modulator 120, the phase detection circuit 140 and so on. The switch SW3 is switched by the sequencer 180 in accordance with the conditions of the register 170 set from the base band LSI 300. Of the components constituting the loop filter LPF1, the resistors R1 and R2 may be formed on the chip of the radio frequency IC 100 together with the switch SW3. Preferably, the capacitors C0 and C1 are formed as external components so as to prevent the chip size from increasing.

Figure 3:
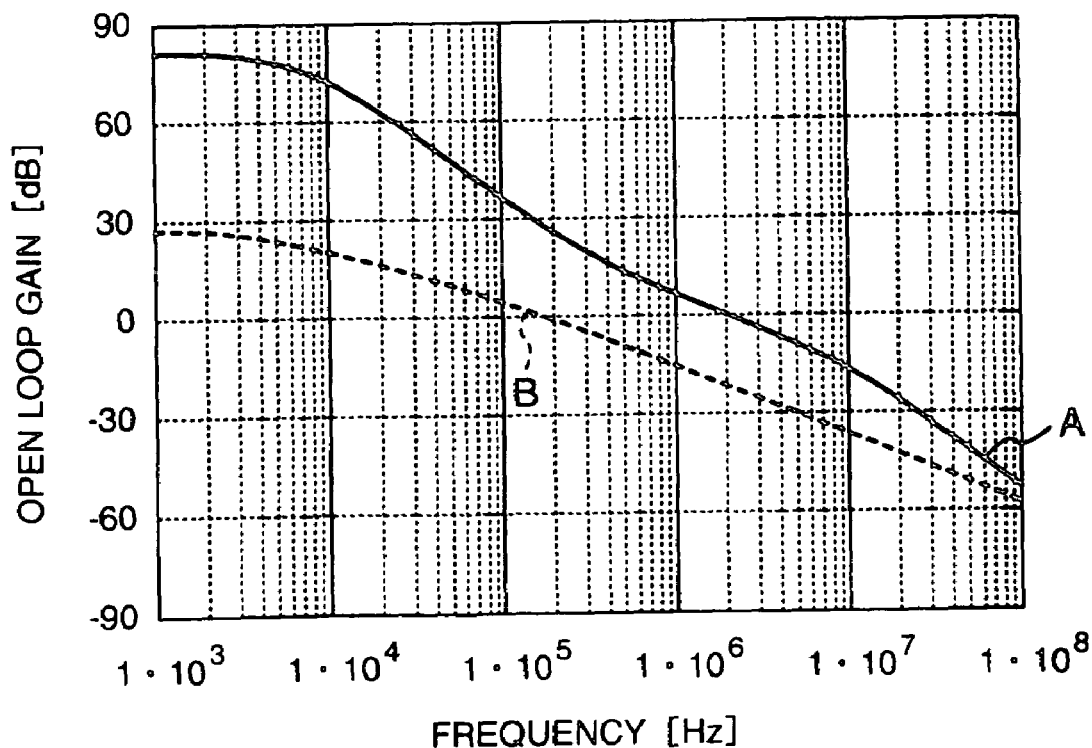
FIG. 3 is a graph showing the open gain characteristic of an amplitude control loop in the transmitter in FIG. 1.

On the other hand, in GMSK mode it is preferable that the AM loop filter LPF2 on the amplitude loop has a narrow open loop frequency bandwidth from the point of view of the stability of the loop and the suppression of noise as shown in the broken line B in FIG. 3. However, preferably, in EDGE mode the loop bandwidth is wider in order to enhance dot lines vector magnitude (EVM) and improve the spectral regrowth. Accordingly, in this embodiment, the AM loop filter for EDGE comprises two poles at low frequencies near 7 KHz and 10 KHz respectively, a zero near 0.3 MHz and a pole at the high frequency near 10.8 MHz. In EDGE mode, the open loop bandwidth of the AM loop filter is set near 1.8 MHz. The filter is constituted by capacitors C2 and C3 and a resistor R3 which is connected in series with the capacitor C3, and a capacitor 4.

In the amplitude loop including such a higher-order loop filter LPF2, although the amplitude can be controlled with high accuracy, the phase margin is reduced so that the stability of the AM loop is not inconsistently stable. Therefore, in this embodiment, as shown in FIG. 1, a load LPF3 is provided separately from the loop filter LPF2 so as to set the loop to have only one pole at low frequency as a whole, and a switch SW2 is provided for changing over between the loop filter LPF2 and the load LPF3. When high accurate amplitude control is required, the switch SW2 is switched to the filter LPF2 side so as to operate the loop with the filter LPF2. When high accurate amplitude control is not required, or when the stability of the loop is to be enhanced especially, the switch SW2 is switched to the load LPF3 side so as to operate the loop with the load LPF3 while increasing the phase margin, with the result that the loop can be stabilized. This operation will be described later again.

When the transmission circuit in this embodiment operates in the 8-PSK modulation mode, in the amplitude loop, the output of the power amplifier 210 is detected by the coupler 220. The detection signal is down-converted into an intermediate frequency band (IF) by the mixer 132, amplified by the variable gain amplification circuit MVGA, and supplied as a feedback signal SFB to the amplitude detection circuit 150. Then, a transmitting signal modulated by the orthogonal modulator 120 is compared with the feedback signal SFB by the amplitude detection circuit 150 so that an amplitude difference is detected. The amplitude difference is filtered by the AM loop filter LPF2, amplified by the variable gain amplification circuit IVGA, filtered by the AM loop filter LPF1 and applied as a control voltage VAPC to the output control terminal of the power amplifier 210. The amplitude control is thus performed.

In this embodiment, the power amplifier 210 is constituted by an FET or the like. A driving voltage (Vdd) proportional to the control voltage VAPC is generated by a voltage control circuit (reference numeral 230 in FIG. 4) provided in the power module 200. The driving voltage is applied to the drain terminal or the source terminal of the FET. On the other hand, an appropriate bias voltage VBIAS generated by a not-shown bias circuit is applied to the gate terminal of the power FET.

Here, description will be made of the gain control of the variable gain amplification circuit IVGA on the forward path and the variable gain amplification circuit MVGA on the feedback path.

In cellular phone terminals supporting EDGE or GSM, power control is performed to increase or decrease output power POUT of a power amplifier to a desired value in a predetermined time. In the polar loop, such power control is performed by controlling the gain of the variable gain amplification circuit MVGA. Specifically, the feedback signal to the amplitude detector decreases when the gain of the variable gain amplification circuit MVGA is reduced. Accordingly, the AM loop is reacting by increasing the RF gain GPA (POUT/PIN) of the power amplifier to make the feedback signal coincide with the reference signal from the modulator. Thus, when the MVGA gain is reduced, the output power POUT increases. When decrease in the output power POUT is desired, the gain of the variable gain amplification circuit MVGA must be increased to decrease the output power POUT. In this embodiment, the gain control of the variable gain amplification circuit MVGA is carried out by the control voltage VRAMP from the base band LSI 300. In addition, the rate of decrease or increase of the gain GMVGA of the variable gain amplification circuit MVGA is equal to the rate of increase or decrease of the RF gain GPA of the power amplifier because of the control of the AM loop.

Figure 5:
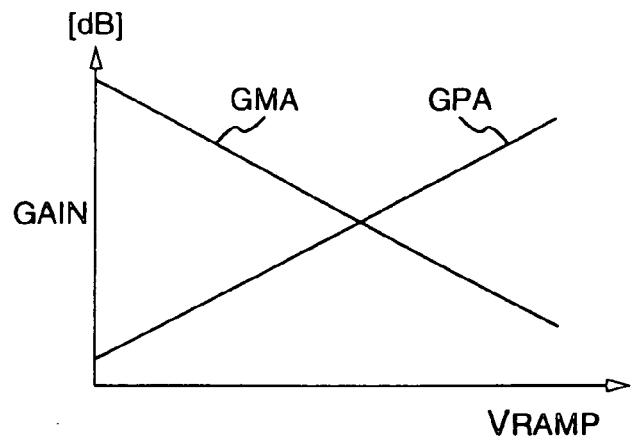
FIGS. 5(A) and 5(B) are graphs showing the relationship between an output control voltage VRAMP and the gains of an output power amplifier and a variable gain amplification circuit in the transmitter of a polar loop system according to the invention, and the relationship between the output control voltage VRAMP and the output power of the output power amplifier, respectively.
Figure 5:
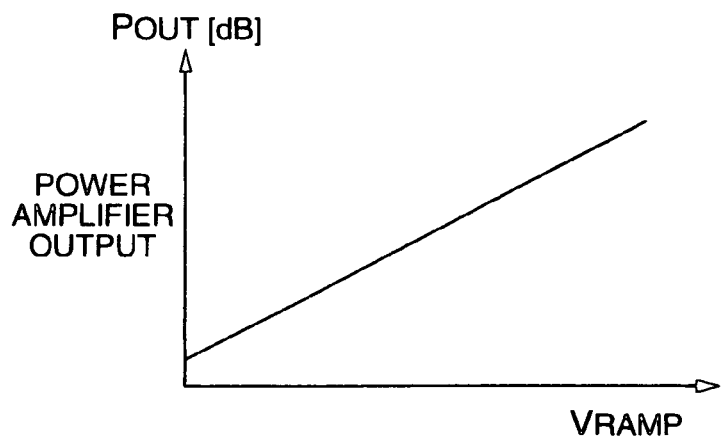

Accordingly, the change of the gain of the variable gain amplification circuit MVGA with respect to the control voltage VRAMP forms a rightward-downward straight line as shown by the solid line GMA in FIG. 5(A). On the contrary, the change of the gain of the power amplifier 210 with respect to the control voltage VRAMP forms a rightward-upward straight line as shown by the solid line GPA in FIG. 5(A). In addition, as a result, the output power POUT of the power amplifier 210 increases linearly with respect to the control voltage VRAMP as shown in FIG. 5(B). The relationship between the output power 210 enpowered the dBm and the control voltage VRAMP empowered in the VRAMP is linear thanks to the characteristic of the MVGA.

While the reference signal SREF from the modulator 120 is a signal modulated in 8-PSK so that the amplitude component of the signal varies, control is performed so that the amplitude component of the output power POUT of the power amplifier coincides with the reference signal SREF by the operation of the amplitude control loop. At this time, the output power POUT of the power amplifier 210 is kept to be a desired value by the above-mentioned power control. In such a manner, the polar loop produces at the output of the power amplifier an amplitude modulation very similar to the original amplitude modulation of the 8-PSK signal produced by the modulator 120.

Figure 4:
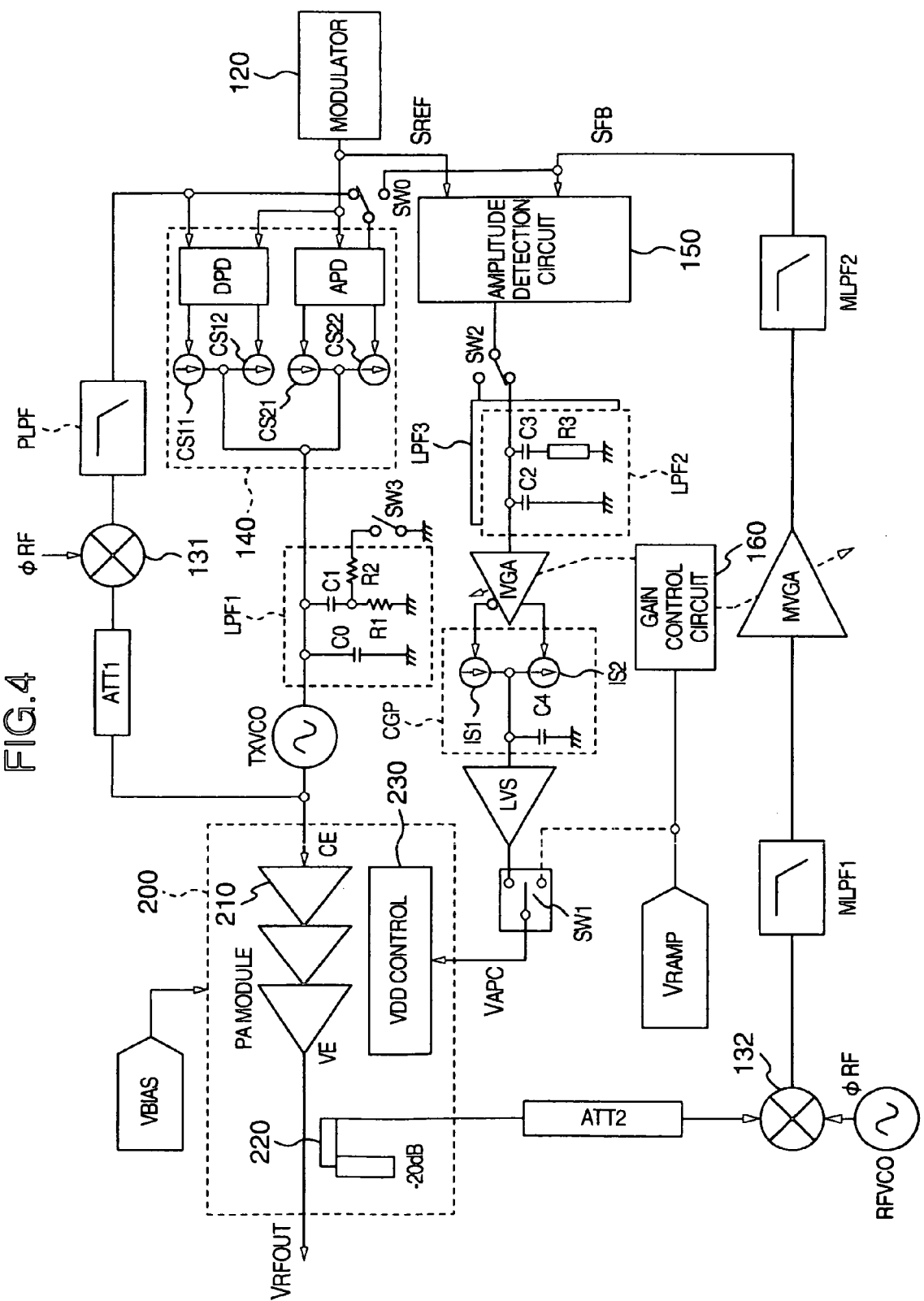
FIG. 4 is a block diagram showing a more detailed configuration example of a polar loop in the transmitter in FIG. 1.

FIG. 4 shows an example of a more detailed configuration of the transmission circuit to which the polar loop system has been applied. As shown in FIG. 4, in this embodiment, the phase detection circuit 140 is constituted by a digital phase comparator DPD, an analog phase comparator APD, a pair of constant current sources CS11 and CS12 controlled by the differential output of the digital phase comparator DPD, and a pair of constant current sources CS21 and CS22 controlled by the differential output of the analog phase comparator APD. As will be described later, phase comparison is first carried out by the digital phase comparator DPD at the beginning of transmission, and then switched to the analog phase comparator APD so that the phase loop can be locked at a high speed. Incidentally, the magnitudes of the currents of the constant current sources CS11 and CS12 controlled by the digital phase comparator DPD are made equal to each other, and the magnitudes of the currents of the constant current sources CS21 and CS22 controlled by the analog phase comparator APD are made equal to each other. In addition, when the loop filter LPF1 is shared between the digital phase comparator DPD and the analog phase comparator APD, it is desired that the current of the constant current source CS11, CS12 controlled by the digital phase comparator DPD is set to be about 4 times as large as the current of the constant current source CS21, CS22 controlled by the analog phase comparator APD.

Charge pumps are constituted by the constant current sources CS11 and CS12 and the capacitors C0 and C1 of the phase loop filter LPF1 and by the constant current sources CS21 and CS22 and the capacitors C0 and C1 of the loop filter LPF1 respectively. A voltage proportional to the phase difference between a modulated signal and a feedback signal detected by the digital phase comparator DPD or the analog phase comparator APD is charged into the capacitors C0 and C1. The transmitting oscillator TxVCO oscillates in accordance with the charged voltage of the capacitors C0 and C1 so as to generate a signal whose phase coincides with the phase of the modulated signal outputted from the modulator 120.

Though not shown in FIG. 1, on the feedback path of the phase loop, an attenuator ATT1 for attenuating the output of the transmitting oscillator TxVCO and supplying the attenuated output to the mixer 131 is provided between the oscillator TxVCO and the mixer 131, and a low pass filter PLPF for eliminating harmonics is provided between the mixer 131 and the phase detection circuit 140. On the other hand, on the feedback path of the amplitude loop, an attenuator ATT2 is provided between the coupler 220 and the mixer 132, and low pass filters MLPF1 and MLPF2 for eliminating unnecessary waves or harmonics are provided between the mixer 132 and the variable gain amplification circuit MVGA and between the variable gain amplification circuit MVGA and the amplitude detection circuit 150 respectively.

In this embodiment, a charge pump CGP and a level shift circuit LVS are provided in a stage after the variable gain amplification circuit IVGA. The charge pump CGP carries out charging or discharging with the differential output of the variable gain amplification circuit IVGA so as to integrate the current output of the variable gain amplification circuit IVGA. The level shift circuit LVS shifts the voltage generated in the charge pump by about 0.6 V in the negative direction. The charge pump CGP is constituted by a pair of current sources IS1 and IS2 and a capacitor C4. The level shift circuit LVS is provided because a voltage down to 0 V has to be applied as a control voltage to the output power module 200 while the charge pump cannot supply 0 V due to the nature of the current source IS2.

As described previously, when the switch SW3 is turned off in the GMSK modulation mode while the switch SW3 is turned on in the 8-PSK modulation mode to switch the frequency bandwidth of the loop filter LPF1. In that case, the current value of the constant current source CS21, CS22 of the analog phase comparator APD is changed simultaneously between the GMSK modulation mode and the 8-PSK modulation mode. Specifically, it is desired that the current value of the constant current source CS21, CS22 is changed so that the value (for example, 3.2 mA) in the 8-PSK modulation mode is about twice as large as the value (for example, 1.4 mA) in the GMSK modulation mode.

The frequencies of the transmitting oscillator TxVCO used in the GSM system and the DCS system or the PCS system are 900 MHz and 1,800 MHz or 1,900 MHz, respectively. Oscillators TxVCO different in sensitivity to the control voltage from the charge pump may be used. In such a case, the current value of the constant current source CS21, CS22 of the analog phase comparator APD is changed (so that the value in DCS or PCS is made 0.7 mA which is a half of the value in GSM). When this embodiment is applied to such a system, it is desired that the current value of the constant current source CS21, CS22 is changed so that the value (for example 1.6 mA) in the 8-PSK modulation mode in the DCS or PCS system is about twice as large as the value (for example, 0.7 mA) in the GMSK modulation mode.

Here, description will be made of the phase detection circuit 140 for use in the transmission circuit of the polar loop system according to this embodiment. In this embodiment, as described previously, the phase detection circuit 140 is constituted by a digital phase comparator DPD, an analog phase comparator APD, a pair of constant current sources CS11 and CS12 controlled by the differential output of the digital phase comparator DPD, and a pair of constant current sources CS21 and CS22 controlled by the differential output of the analog phase comparator APD. Phase comparison is first carried out by the digital phase comparator DPD at the beginning of transmission, and then switched to the analog phase comparator APD so that the phase loop can be locked at a high speed.

Figure 7:
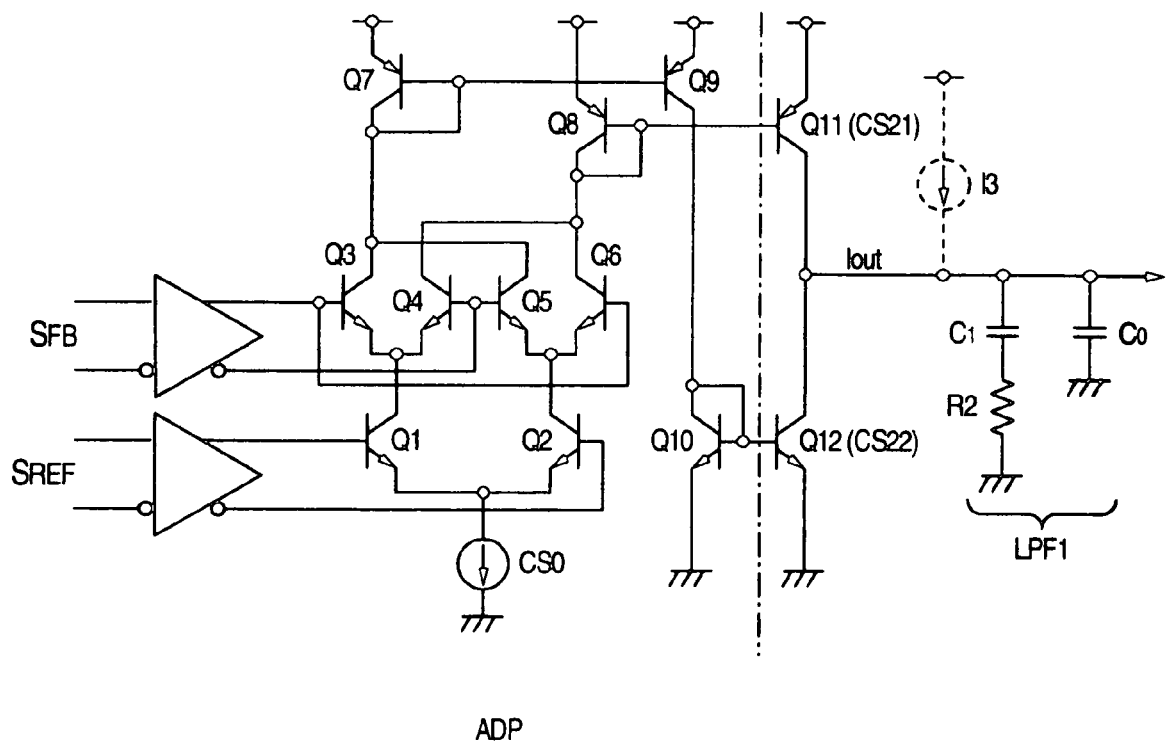
FIG. 7 is a circuit diagram showing a specific example of a general analog phase detection circuit in the conventional art.
Figure 8:
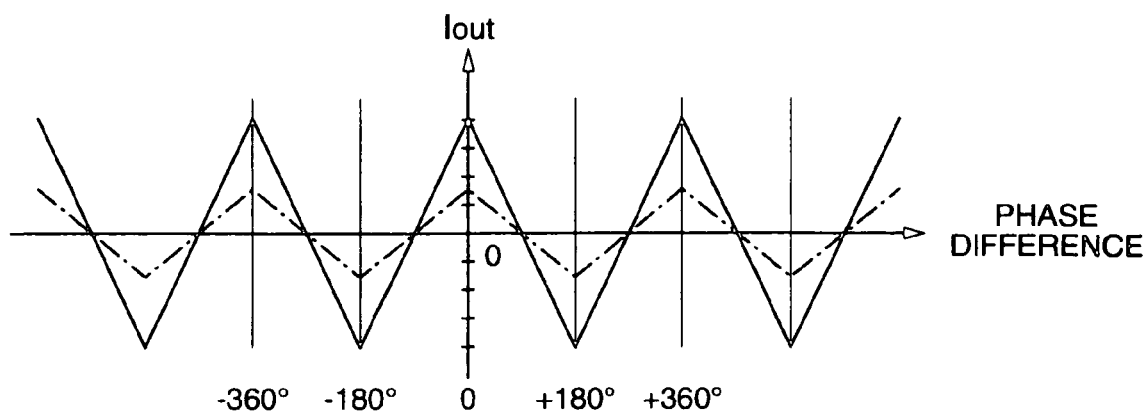
FIGS. 8(A) and 8(B) are graphs showing the relationship between the phase difference between input signals and the output current in the analog phase detection circuit of FIG. 7.
Figure 8:
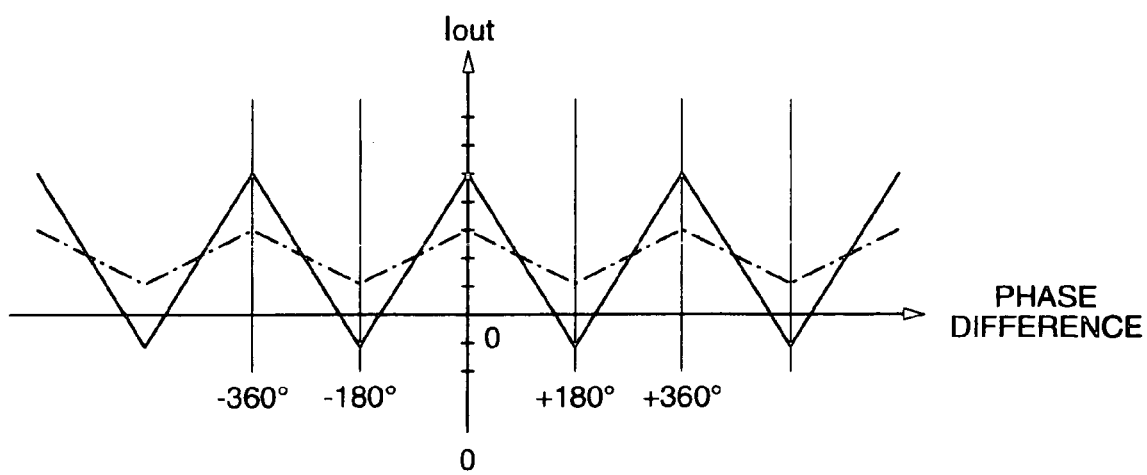

At first, the present inventors investigated that an analog phase comparator APD constituted by a multiplication circuit as shown in FIG. 7 was used as the phase detection circuit 140 in the polar loop. Such an analog phase comparator APD is used in a conventional cellular phone of a GSM system. FIG. 8(A) shows the relationship between the output current Iout and the phase difference between input signals in the analog phase comparator APD of FIG. 7. In FIG. 8(A), the solid line designates the waveform of the output current Iout with respect to the phase difference when the frequency of a reference signal SREF is identical to the frequency of an input signal SFB (feedback signal), and the chain line designates the waveform of the output current Iout with respect to the phase difference when the frequency of the input signal SFB is ⅓ of the frequency of the reference signal SREF. In the phase loop using the circuit of FIG. 7, the loop is locked in respective points where the output Iout takes "0" in FIG. 8(A), that is, the phase difference is ±90° and ±270°. That is, there are a plurality of lock points, and at the same time, there is a fear that the loop may be locked also in undesired cases where the frequency of the input signal SFB is generally (2M+1)/(2N+1) (N and M are integers) of the reference signal SREF.

In this case, when a constant current source I3 as shown by the broken line is provided in the analog phase comparator APD of FIG. 7 so as to shift the output current Iout as a whole as shown in FIG. 8(B), it is possible to avoid the lock of the loop at undesired frequencies. However, in spite of such a countermeasure, the analog phase comparator of FIG. 7 has still a disadvantage that the loop is locked at a plurality of points. In addition, the phase range where the lock can be done is narrow, and the time required for locking (lock up time) is determined by the output current Iout and the capacitance values of the capacitors Co and C1 of the loop filter LPF1. In addition, the lock up time of the analog phase comparator APD is long to be several hundreds of μsec. Thus, it was found that the lock up time of 10 μsec or shorter required in the EDGE system could not be attained at all.

Figure 9:
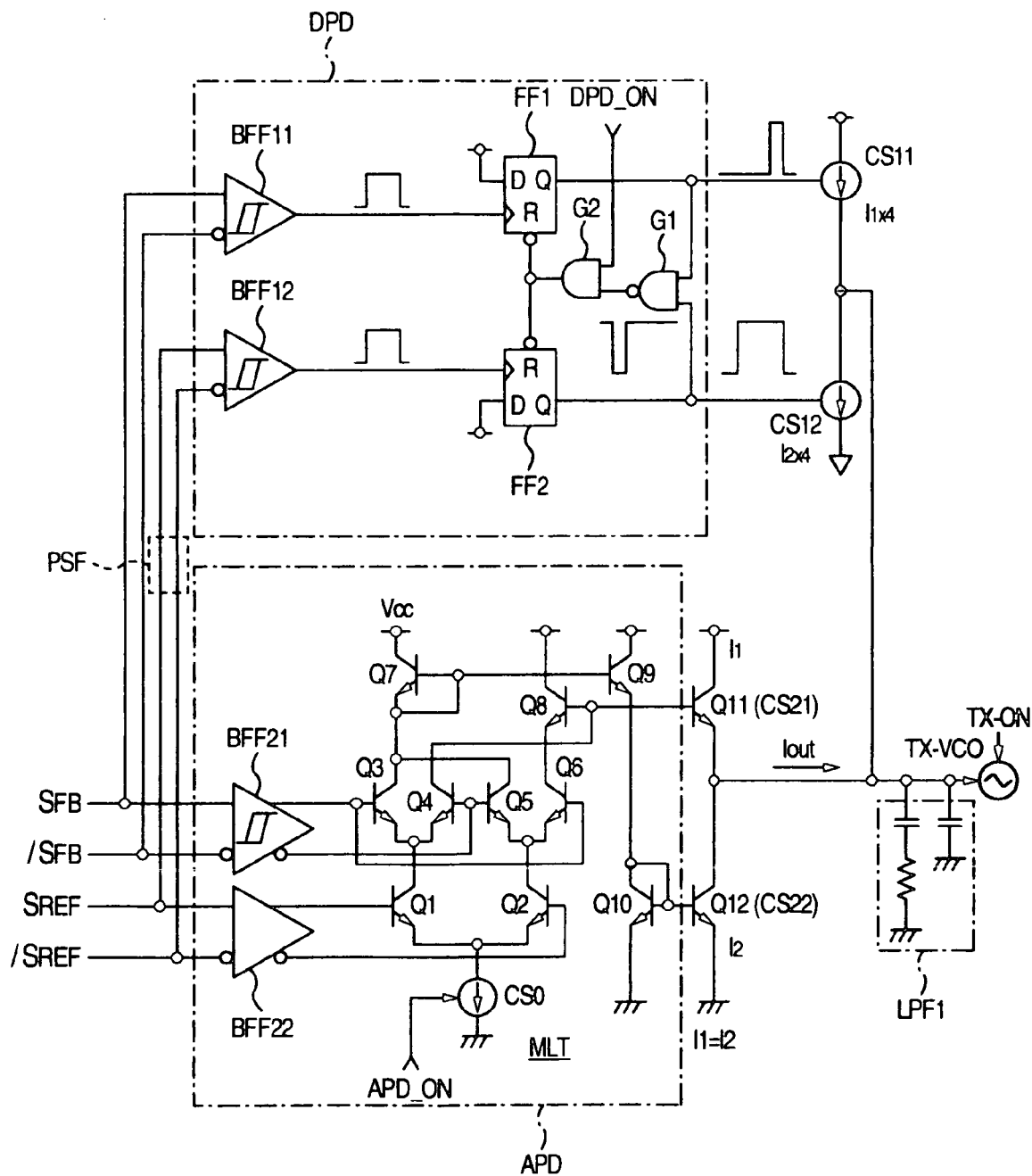
FIG. 9 is a circuit diagram showing a specific example of a phase detection circuit used in the embodiment of the invention.

In this embodiment, therefore, the phase detection circuit 140 is constituted by a digital phase comparator DPD and an analog phase comparator APD as shown in FIG. 9. The digital phase comparator DPD is operated earlier, so that the phase loop can be locked at a high speed.

The digital phase comparator DPD is constituted by buffers BFF11 and BFF12, D-type flip-flops FF1 and FF2, a NAND gate G1, and an AND gate G2. The buffers BFF11 and BFF12 have differential inputs and a single output, and receive differential input signals SFB and /SFB and reference signals SREF and /SREF as their inputs, respectively. The D-type flip-flops FF1 and FF2 carry out latch in response to the buffers BFF11 and BFF12, respectively. The NAND gate G1 receives, as its inputs, the outputs of the flip-flops FF1 and FF2. The AND gate G2 receives, as its inputs, the output of the NAND gate G1 and an activation signal DPD_ON.

It is desired that each of the buffers BFF11 and BFF12 is a circuit having a function as a limiter for shaping the sine waveform of input signals so as to output the signals as square waves. As soon as the activation signal DPD_ON is set at a high level, the digital phase comparator DPD starts the phase comparison operation so that the flip-flops FF1 and FF2 carry out latch in response to the rising of the outputs of the buffers BFF11 and BFF12. Thus, both the outputs of the flip-flops FF1 and FF2 change into a high level. Then, when both the outputs of the two flip-flops FF1 and FF2 reach the high level, the flip-flops FF1 and FF2 are reset through the NAND gate G1.

As a result, the output pulse width of an earlier-phase one of the flip-flops FF1 and FF2 is broader than the output pulse width of the other. Thus, the current of the current source CS11 or CS12 is made to more flow correspondingly to this broader pulse width. Accordingly, the charging voltages of the capacitors C0 and C1 of the loop filter LPF1 are changed so that the control voltage to the transmitting oscillator TxVCO is changed. Thus, the phase of the output of the transmitting oscillator TxVCO is advanced or delayed. When the phase of the input signal SFB coincides with the phase of the reference signal SREF, the charging current of the current source CS11 balances with the charging current of the current source CS12 so that the charging voltages of the capacitors C0 and C1 of the loop filter LPF1 are constant and locked.

Figure 11:
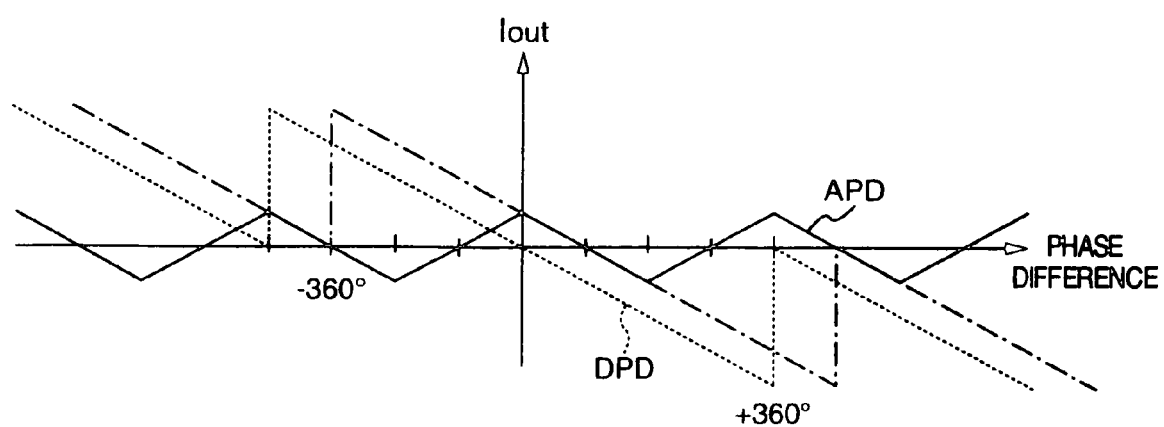
FIG. 11 is a graph showing the relationship between the phase difference between input signals and the output current in the phase detection circuit of FIG. 9.

At this time, as shown by the chain line in FIG. 11, when the phase difference is −360°, 0° or 360°, the output current Iout becomes "0" so that the digital phase comparator DPD is locked. When compared with FIGS. 8(A) and 8(B) showing the output current waveform of the analog phase comparator APD, it is understood that the digital phase comparator DPD has a phase pull-in range of 720° which is wider than the phase pull-in range of 180° in the analog phase comparator APD. In addition, since the digital phase comparator DPD has one lock point, there is no fear of causing imaginary lock. Thus, when the phase pull-in of the loop is carried out first by this digital phase comparator DPD, the pull-in can be carried out at a high speed (8 μsec or shorter).

Figure 10:
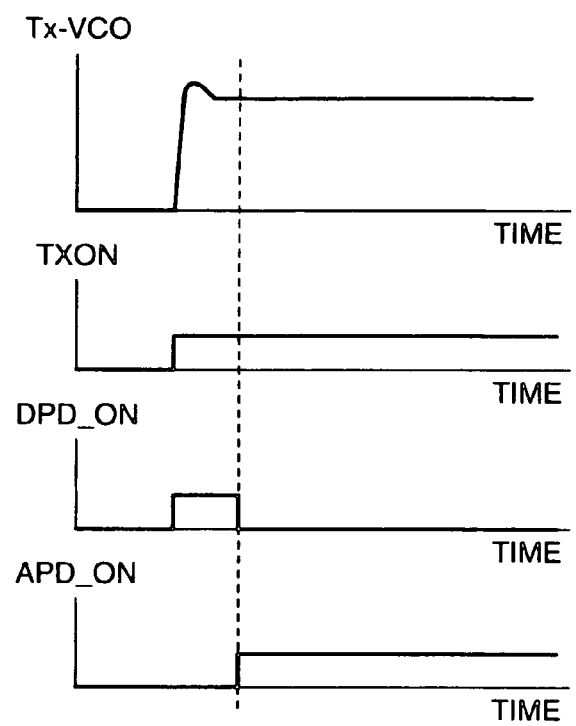
FIG. 10 is a timing chart showing timings of respective signals in the phase detection circuit of FIG. 9.

As described previously, a shoot-through current based on the charge current of the current source CS11 and the discharge current of the current source CS12 flows in the digital phase comparator DPD when the phases coincide with each other. Thus, spurious noise occurs in the output of the transmitting oscillator TxVCO due to this shoot-through current. Consequently, control signals DPD_ON and APD_ON are generated at the timings as shown in FIG. 10, so that switching to the analog phase comparator APD is carried out after the phase is locked by the digital phase comparator DPD. Thus, the lock up time can be shortened while avoiding noise generation at the time of transmission and reception. The control signals DPD_ON and APD_ON can be supplied from the sequencer 180 shown in FIG. 1.

The analog phase comparator APD is constituted by buffers BFF21 and BFF22, and a multiplication circuit MLT. The buffers BFF21 and BFF22 have differential inputs and differential outputs, and receive the differential input signals SFB and /SFB and the reference signals SREF and /SREF as their inputs respectively. The multiplication circuit MLT receives the outputs of the buffers BFF21 and BFF22 as its inputs. Preferably, the buffer BFF21 is a circuit having a function as a limiter for shaping the sine waveform of the input signals SFB and /SFB so as to output the signals as square waves.

The multiplication circuit MLT is constituted by differential twin transistors Q1 and Q2 whose bases receive the differential output of the buffer BFF21; a constant current source CS0 connected to a common emitter of the transistors Q1 and Q2; differential twin transistors Q3 and Q4 whose common emitter is connected to the collector of the transistor Q1 and whose bases receive the differential output of the buffer BFF21; differential twin transistors Q5 and Q6 whose common emitter is connected to the collector of the transistor Q2 and whose bases receive the differential output of the buffer BFF21; a transistor Q7 connected between the collector of the transistor Q3 and a power supply voltage Vcc; a transistor Q8 connected between the collector of the transistor Q6 and the power supply voltage Vcc; a transistor Q9 connected to the transistor Q7 so as to form current mirrors; and a transistor Q10 connected in series with the transistor Q9. Then, the transistor Q8 and a transistor Q11 as the constant current source CS21 of the charge pump are connected to form current mirrors. In addition, the transistor Q10 and a transistor Q12 as the constant current source CS22 of the charge pump are connected to form current mirrors.

When the constant current source CS0 is activated in an ON state by the control signal APD_ON, this analog phase comparator APD is activated to start comparing a phase difference between the input signal SFB and the reference signal SREF and output a current Iout proportional to the phase difference as shown by the solid line in FIG. 11. Here, if a comparison is made between the output current characteristic (solid line) of the analog phase comparator APD and the output current characteristic (broken line) of the digital phase comparator DPD as shown in FIG. 11, the phase lock occurs in the digital phase comparator DPD when the phase difference is zero, and the phase lock occurs in the analog phase comparator APD when the phase difference is ±90°.

From this reason, even if switching to the analog phase comparator APD is carried out after the phase of the loop is locked by the digital phase comparator DPD, the phase is always locked again (resynchronization) by the analog phase comparator APD with the phase shifted by 90° after the switching. However, since the time required for this resynchronization is not longer than 1 μsec, it hardly matters. In addition, there is a fear that the control voltage for the transmitting oscillator TxVCO may fluctuate slightly. If the time required for the resynchronization or the fluctuation of the VCO control voltage is concerned, for example, a phase shifter for shifting the phase by 90° may be provided at a place shown by the broken line PSF in FIG. 9, so as to shift by 90° the phases of the reference signals SREF and /SREF supplied to the digital phase comparator DPD.

Thus, as shown by the chain line in FIG. 11, the output current characteristic of the digital phase comparator DPD is shifted so that the phase lock point in the digital phase comparator DPD can be matched with the phase lock point in the analog phase comparator APD. Thus, the delay at the time of switching or the fluctuation of the control voltage can be prevented. Incidentally, the phase shifter may be provided not on the input side of the digital phase comparator DPD but on the input side of the analog phase comparator APD.

Next, description will be made in detail of the configuration and operation of the amplitude loop in the transmission circuit of the polar loop system according to this embodiment.

In this embodiment, as described previously, from the point of view of trade-off between improvement in the stability of the amplitude loop and the suppression of noise, and improvement in the error vector magnitude and the spectral regrowth, a filter which is constituted by capacitors C2 and C3 and a resistor R3 connected in series with the capacitor C3 and which has two poles and zero as shown by the solid line A in FIG. 3 is used as the loop filter LPF2 on the amplitude loop in order to set the open loop frequency bandwidth of the amplitude loop 1.8 MHz wide.

Figure 13:
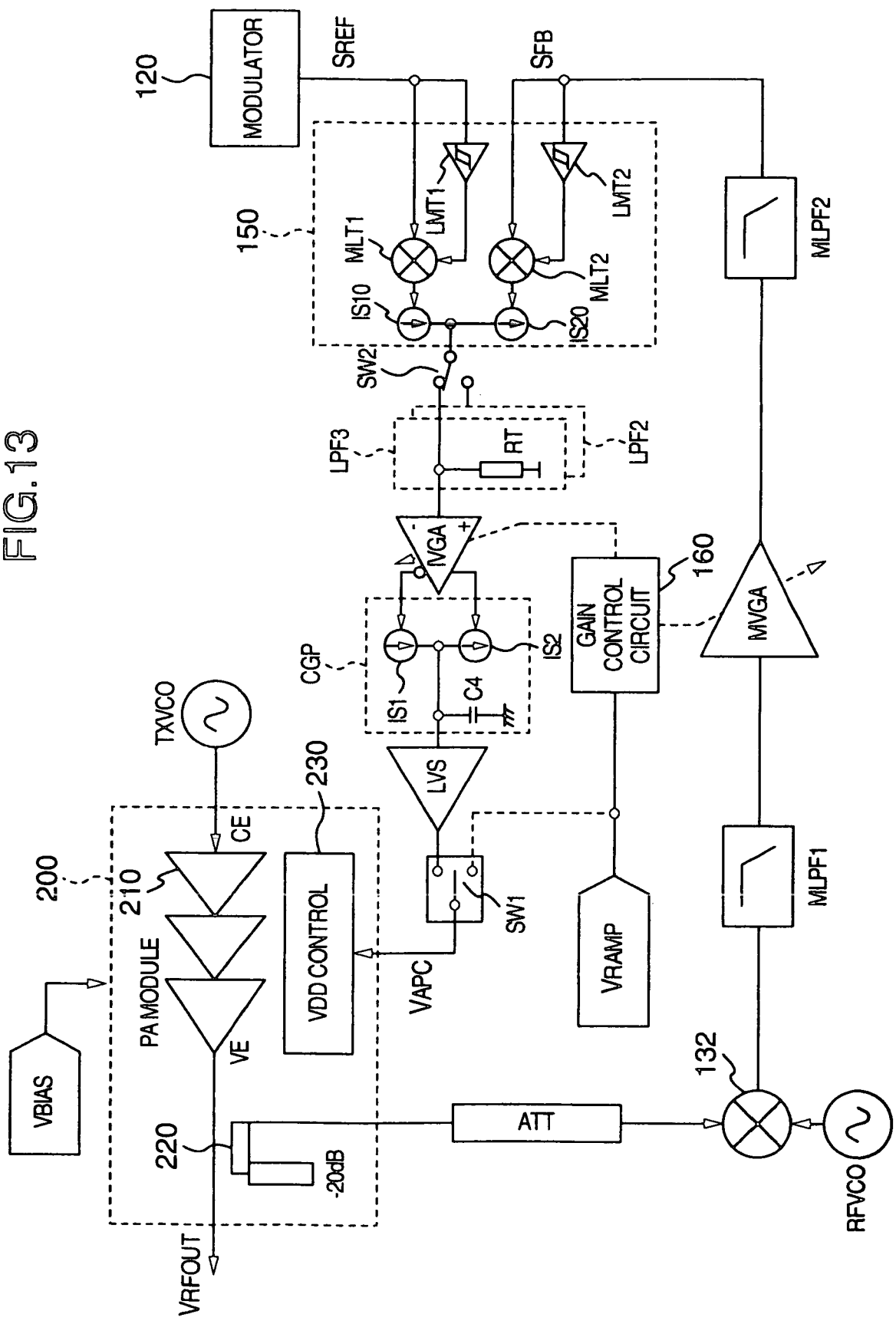
FIG. 13 is a block diagram showing a more detailed configuration example of the amplitude control loop when a loop filter on the amplitude control loop has been switched to a load LPF 3 in the transmitter of FIG. 1.

In the amplitude loop including such a high-order loop filter LPF2 having a low frequency, one zero and one pole of high frequency, although amplitude control can be carried out with high accuracy, the phase margin depends on the open loop gain. Therefore, in this embodiment, as shown in FIG. 13, a load LPF3 is provided separately from the loop filter LPF2 so as to set the loop to have only one low frequency pole as a whole, and a switch SW2 is provided for changing over between the loop filter LPF2 and the load LPF3. When high accurate amplitude control is required, the switch SW2 is switched to the filter LPF2 side so as to operate the loop with the filter LPF2. When high accurate amplitude control is not required, or when the stability of the loop is required especially, the switch SW2 is switched to the load LPF3 side so as to operate the loop with the load LPF3 while increasing the phase margin. Thus, the loop can be stabilized.

As a result, when the load LPF3 is used to correct the scattering of the loop gain caused by scattering in manufacturing, the phase margin is increased to stabilize the loop and hence to facilitate calibration. On the contrary, when high accurate amplitude control is required, for example, in the 8-PSK modulation mode, the loop filter LPF2 is used to enhance the error vector magnitude or to improve the spectral regrowth. In the amplitude loop provided with the load LPF3, as described previously, a charge pump CGP constituted by current sources IS1 and IS2 and a capacitor C4 also having a function as a loop filter is provided in a stage after the variable gain amplification circuit IVGA. Therefore, the load LPF3 can be constituted by only a resistor RT1.

In the radio frequency IC according to this embodiment, the load LPF3 is used to control the gains of the variable gain amplification circuits IVGA and MVGA of the amplitude loop in accordance with the output control voltage VRAMP from the base band LSI 300 so that the output control voltage VAPC supplied to the power module 200 is generated. Thus, an APC circuit which has been required in the background-art GSM system, for detecting the output level and controlling the output of the power amplifier 210 can be omitted. This reason is as follows. When the amplitude loop is used in the GMSK modulation mode, amplitude modulation is not necessary. Thus, the stability of the amplitude loop is higher than that in the 8-PSK modulation mode. The GMSK mode has to cover a higher range of output powers (+33 dBm in GSM, +30 dBm in DCS) than the EDGE mode. At the highest power levels, the noise in the receive band is also amplified. It is therefore desired that the loop bandwidth is set to be, for example, 200 kHz, narrower than the aforementioned bandwidth 1.8 MHz of the amplitude loop in the 8-PSK modulation mode. Accordingly, as the loop filter, the load LPF3 for setting the loop to have only one low frequency pole as a whole is preferred to the filters LPF2 and LPF4 having two low frequency poles one zero and a high frequency pole.

FIGS. 12(A) and 12(B) show the open loop frequency characteristic of the amplitude loop when the loop filter LPF2 is used. Of them, FIG. 12(A) shows the gain characteristic of the amplitude loop, while FIG. 12(B) shows the phase characteristic of the amplitude loop. PM0 to PM2 designates phase margins. Reduction in phase margin is a problem because it spoils the stability of the amplitude loop. The open loop gain GAMOP of the amplitude loop fluctuates up and down in accordance with the fluctuation of the gain GMVGA of the variable gain amplification circuit MVGA. At this time, the phase of the loop hardly changes. Thus, the phase margin at PM1 or PM2 is reduced in comparison with PM0 where the gain of the variable gain amplification circuit MVGA has no fluctuation.

Figure 6:
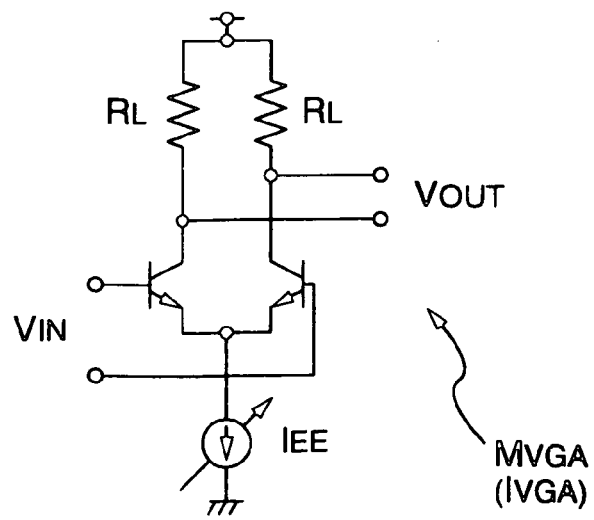
FIG. 6 is a circuit diagram showing a specific example of the variable gain amplification circuit used in the embodiment of the invention.

In this embodiment, this problem is solved by controlling the variable gain amplification circuit IVGA on the forward path and the variable gain amplification circuit MVGA on the feedback path so that the sum (GIVGA+GMVGA) of gains GIVGA and GMVGA of the variable gain amplification circuits IVGA and MVGA becomes constant as shown in FIG. 5(A). That is, when the gain of the variable gain amplification circuit MVGA on the feedback path is changed to increase (decrease) so as to control the output power POUT of the power amplifier, the gain of the variable gain amplification circuit IVGA on the forward path is decreased (increased) in the opposite way to the increase (decrease) of the gain of the variable gain amplification circuit MVGA. Thus, the open loop characteristic of the amplitude loop is kept so constant that the phase margin can be prevented from being reduced. For example, when the variable gain amplification circuit MVGA is constituted by a circuit as shown in FIG. 6, the bias current IEE thereof is changed exponentially so that the gain can be controlled to change linearly with respect to the control voltage VRAMP.

On the other hand, when amplitude modulation is unnecessary, for example, in the GMSK modulation mode, a low-order filter such as the load LPF3 which can make the bandwidth narrow enough to enhance noise suppression capability in the reception signal frequency band 20 MHz distant from the carrier frequency is preferred because the frequency bandwidth of the amplitude loop is not necessarily extended to enhance the error vector magnitude as shown in FIG. 12(A). In this embodiment, the load LPF3 has a frequency characteristic as shown by the broken line B in FIG. 3. The resistance value of the resistor RT1 is set so that the open loop frequency bandwidth of the amplitude loop is about 200 kHz. Because there is only one low frequency pole in the amplitude loop using the load LPF3, the phase never turns over 90°. Thus, the stability of the loop is guaranteed. Accordingly, when the load LPF3 and the change-over switch SW2 are provided separately from the loop filter LPF2 as in this embodiment, and the amplitude loop using the load LPF3 is used in the GMSK modulation mode, an APC circuit can be omitted, and the radio frequency IC according to this embodiment can be used in a GSM system. The switch SW2 is switched by the sequencer 180 in accordance with the conditions of the register 170 set from the base band LSI 300.

As shown in FIG. 13, the amplitude detection circuit 150 is constituted by a limiter LMT1 for shaping the waveform of the reference signal SREF from the modulator 120; a multiplier MLT1 for generating a signal obtained by multiplying a rectangular wave produced by the limiter LMT1 by the reference signal SREF; a current source IS10 controlled by the output of the multiplier MLT1; a limiter LMT2 for shaping the waveform of the feedback signal SFB from the amplitude loop; a multiplier MLT2 for generating a signal obtained by multiplying a rectangular wave produced by the limiter LMT2 by the feedback signal SFB; and a current source IS20 controlled by the output of the multiplier MLT2. Then, a charge pump is constituted by the current sources IS10 and IS20 and the loop filter LPF2 or the load LPF3, so that a voltage proportional to the amplitude difference between the reference signal SREF and the feedback signal SFB is supplied from the loop filter LPF2 or the load LPF3 to the variable gain amplification circuit IVGA.

Figure 14:
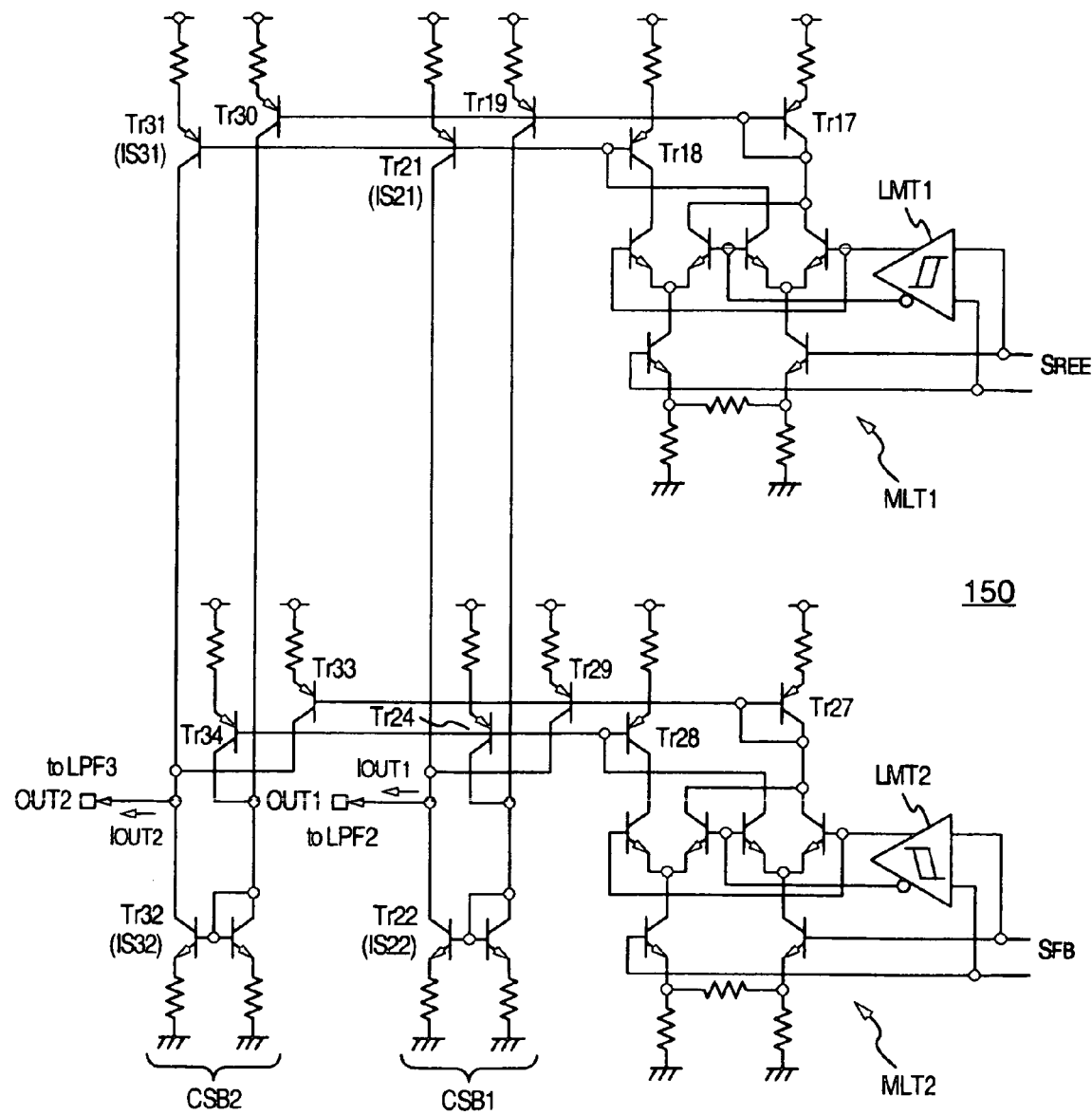
FIG. 14 is a circuit diagram showing a specific example of an amplitude detection circuit used in the embodiment of the invention.

FIG. 14 shows a more specific circuit example of the amplitude detection circuit 150. The multipliers MLT1 and MLT2 are designed similarly to the multiplier MLT constituting the analog phase comparator ADP shown in FIG. 9. In the stages following the multipliers MLT1 and MLT2, current mirror circuits and current subtraction circuits CSB1 and CSB2 are provided for carrying out subtraction on the currents of these current mirror circuits to thereby supply currents IOUT1 and IOUT2 proportional to the amplitude difference between the reference signal SREF and the feedback signal SFB to current output terminals OUT1 and OUT2, respectively. The current subtraction circuit CSB1 is provided for the loop filter LPF2, and the current subtraction circuit CSB2 is provided for the load LPF3.

Specifically, a current of a transistor Tr17 is copied into a transistor Tr19 (Tr30) while a current of a transistor Tr28 is copied into a transistor Tr24 (Tr34) so as to be added thereto, and further copied into a transistor Tr22 (Tr32) as a current mirror. On the other hand, a current of a transistor Tr18 is copied into a transistor Tr21 (Tr31), and a current of a transistor Tr27 is copied into a transistor Tr29 (Tr33) so as to be added thereto. The current of the current mirror transistor Tr22 (Tr32) is subtracted from this additional current so that a current IOUT1 (IOUT2) proportional to the amplitude difference between the reference signal SREF and the feedback signal SFB is supplied to the current output terminal OUT1 (OUT2).

The current mirror transistor Tr21 of the current subtraction circuit CSB1 and the current mirror transistor Tr31 of the current subtraction circuit CSB2 correspond to the current source IS10 in FIG. 13. The current mirror transistor Tr22 of the current subtraction circuit CSB1 and the current mirror transistor Tr32 of the current subtraction circuit CSB2 correspond to the current source IS20 in FIG. 13. In such a manner, the current subtraction circuits CSB1 and CSB2 and the output terminals OUT1 and OUT2 are provided for the loop filter LPF2 and the load LPF3 separately so that the loop gains using the respective filters can be optimized independently of each other. In the embodiment of FIG. 14, the required gain using the filter LPF2 can be optimized by setting the emitter size ratio between the transistors Tr17 and Tr19 while the required gain using the load LPF3 can be optimized by setting the emitter size ratio between the transistors Tr17 and Tr30. In addition, the output impedance of the circuit can be optimized by adjusting the value of the emitter resistances of the transistors Tr19 and Tr30.

Figure 15:
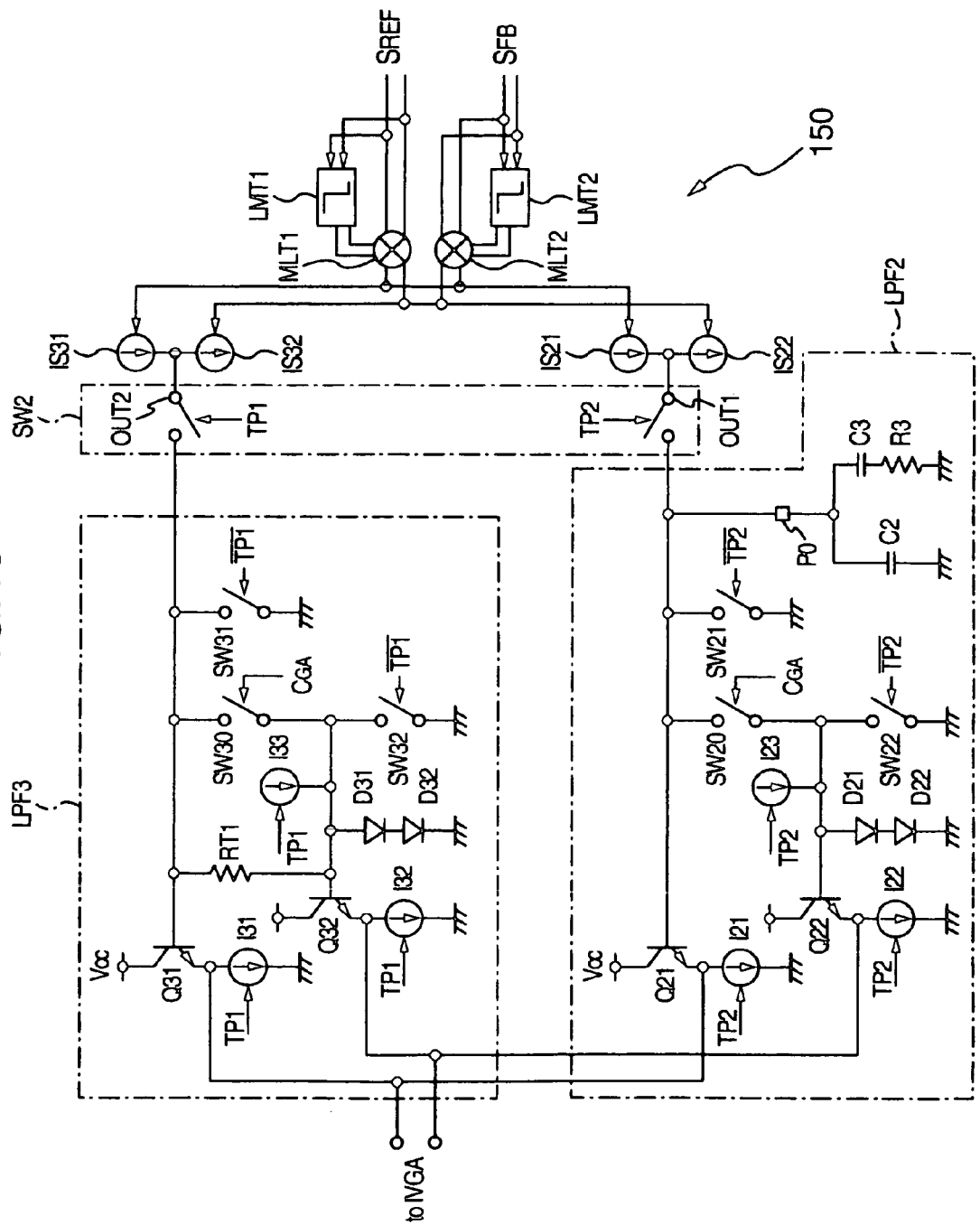
FIG. 15 is a circuit diagram showing a specific example of loop filters and a switching circuit therefor used in the embodiment of the invention.

FIG. 15 shows a specific example of the loop filter LPF2, the load LPF3 and their peripheral circuits. In FIG. 15, the reference sign P0 represents an external terminal provided in the radio frequency IC 100. The capacitors C2 and C3 and the resistor R3 constituting the loop filter LPF2 are connected to the external terminal P0. That is, in this embodiment, the capacitors C2 and C3 and the resistor R3 constituting the loop filter LPF2 are connected as external components. On the other hand, the resistor RT1 constituting the load LPF3 is formed as an internal component on the chip of the radio frequency IC 100. If the capacitors are formed on a semiconductor chip in the existing process technology, the chip area will increase. Therefore, when the capacitors are thus formed as external components as described above, the chip size of the radio frequency IC 100 can be restrained from increasing.

The switch SW2 for changing over between the loop filters LPF2 and the load LPF3 is constituted by a pair of on-off switches. Either the filter or the load is connected to the output terminal (the current output terminal OUT1 or OUT2 in FIG. 14) of the amplitude detection circuit 150 in accordance with a filter selection signal TP1 or TP2. Switches SW21, SW22, SW31 and SW32 are reset switches respectively. Each switch is controlled by an inverted signal /TP1, /TP2 of the selection signal TP1, TP2 so as to be turned on when the filter LPF2 or the load LPF3 is not used. Then, an internal node in each switch is fixed to the ground potential and prevented from floating. Further, current sources I21 to I23 and I31 to I33 turned on/off by the selection signals TP1 and TP2 are provided in the filter LPF2 and the load LPF3, respectively. Current sources on the side of a filter selected by the change-over switch SW2 are turned on concurrently.

An output emitter follower transistor Q21 or Q31 of the filter LPF2 or the load LPF3 is driven by a voltage generated in the capacitors C2 and C3, a wiring parasitic capacitor, and so on, as a result of the integration of the output currents from the current sources IS21 and IS22 or IS31 and IS32 of the amplitude detection circuit 150 in the pre-stage. Thus, a signal supplied to one of the input terminals of the variable gain amplification circuit IVGA in the post-stage is generated. A signal supplied to the other input terminal of the variable gain amplification circuit IVGA is generated as a reference signal at a constant level by an output emitter follower transistor Q22 (Q32) driven by a bias voltage (corresponding to two stages of forward voltages of diodes) from a bias circuit constituted by a current source I23 (I33) and diodes D21 and D22 (D31 and D32). In the load LPF3, an output current IOUT2 proportional to the difference between the currents from the current sources IS31 and IS32 in the pre-stage is applied to the resistor RT1. Thus, the base potential of the output emitter follower transistor Q31 is biased to a potential higher than the base potential of the other transistor Q32 by IOUT2·RT1.

Switches SW20 and SW30 are provided between the base terminals of the output transistors Q21 and Q22 and between the base terminals of the output transistors Q31 and Q32, respectively. When the output of the amplitude detection circuit 150 is not used, the switches SW20 and SW30 are turned on to set the potential difference between the differential inputs of the variable gain amplification circuit IVGA in the post-stage to be "0". The switches SW20 to SW22 and SW30 to SW32 are controlled by the sequencer 180 in accordance with the conditions of the register 170 set from the base band LSI 300.

Although the invention made by the present inventors has been described above specifically along with its embodiment, the invention is not limited to the embodiment. Not to say, the invention can be modified variously without departing from the spirit and the scope of the invention.

For example, the above embodiment has described the case where, in addition to the loop filter LPF2 required to control the amplitude loop with a frequency bandwidth optimum for 6-PSK modulation there is also a load LPF 3 to allow the amplitude loop to operate with a narrower frequency bandwidth and either the filter LPF2 or the load LPF3 is selected by a switch in accordance with required control accuracy. The load LPF3 may be utilized to calibrate the output power of the transmitter with respect to the control signal VRAMP before the start-up of the system. When the output power is to be measured for calibration, the output power cannot be measured accurately if the loop is not stable. Thus, by switching the loop filter in the amplitude loop as described above, the output power of the transmitter can be measured in the state where the loop is stable.

In the above embodiment, the switch SW3 provided in the loop filter LPF1 and for changing the frequency bandwidth of the phase loop in accordance with the modulation mode is provided between the resistor R2 and the ground contact. However, the switch SW3 may be provided between the resistor R2 and the connection node between the capacitor C1 and the resistor R1 constituting the loop filter LPF1. Instead of switching the resistors, a design may be done so that capacitors are switched to change the frequency bandwidth.

Description has been made of the case where the present invention has been applied to a dual band system designed to be able to make communication according to two systems, that is, a GSM system and a DCS 1800 system. However, the invention may be applied to a system designed to be able to make communication according to either of the GSM system and the DCS system, or a triple band system designed to be able to make communication according to a PCS (Personal Communications System) 1900 system in addition to those GSM and DCS systems. According to the invention, communication with phase modulation in the 8-PSK modulation mode as well as in the GMSK modulation mode can be carried out in such a system.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A wireless communication apparatus comprising:
    a base band circuit for generating I and Q signals in accordance with transmitting data;
    a transmitting oscillator for generating a carrier signal;
    a power amplifier for amplifying the carrier signal outputted from the transmitting oscillator;
    a power detector for detecting a power level of a transmitting output signal from the power amplifier; and
    a semiconductor integrated circuit for modulation including an orthogonal modulator for modulating the I and Q signals onto the carrier signal so as to form an oscillating signal of a predetermined frequency, a phase control loop which has a phase detector and controls a phase of the carrier signal, and an amplitude control loop which has an amplitude detector and controls an amplitude of the transmitting output signal,
    wherein the phase control loop includes a feedback path for supplying a signal in accordance with an output of the power detector,
    wherein the amplitude control loop includes the feedback path for supplying a signal in accordance with an output of the power detector, and
    wherein the wireless communication apparatus has a first modulation mode and a second modulation mode, and wherein the phase control loop is shared by the first modulation mode and the second modulation mode.

2. The wireless communication apparatus according to claim 1,
    wherein the first modulation mode is a phase modulation mode using the phase control loop, and
    wherein the second modulation mode is a phase and amplitude modulation mode using both of the phase control loop and the amplitude control loop.

3. The wireless communication apparatus according to claim 1, wherein the phase detector further includes a digital phase detection circuit.

4. The wireless communication apparatus according to claim 1, wherein the amplitude control loop further includes:
    a first variable gain amplifier provided on the feedback path between the power detector and the amplitude detector and for amplifying the signal; and
    a second variable gain amplifier provided on a forward path between a second loop filter and the power amplifier;
    wherein a gain of said first variable amplifier is set in accordance with an output control voltage in the second modulation mode while a gain of the second variable gain amplifier is controlled inversely to that of said first variable gain amplifier.

* * * * *